Figure 1:
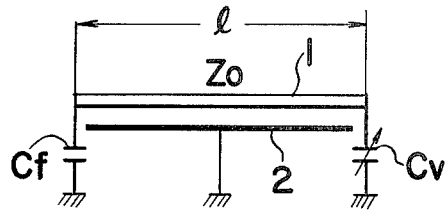

United States Patent [19]

Takeo

[11] 4,025,882
[45] May 24, 1977

[54] UHF TUNER HAVING FREQUENCY SETTING FINE TONED BY VARYING CHARACTERISTIC IMPEDANCE OF RESONANT LINE

[75] Inventor: Hiroshi Takeo, Yao, Japan

[73] Assignee: Sanyo Electric Co., Ltd., Osaka, Japan

[22] Filed: Nov. 17, 1975

[21] Appl. No.: 632,655

[30] Foreign Application Priority Data

Nov. 18, 1974 Japan ............................ 49-133905

[52] U.S. Cl. .................................. 334/45; 334/51; 334/81
[51] Int. Cl.² ......................................... H03J 3/10
[58] Field of Search .......... 333/82 R, 82 B; 334/41, 334/45, 51, 78, 81

[56] References Cited

UNITED STATES PATENTS

| | | | |
|---|---|---|---|
| 2,748,354 | 5/1956 | Lavoo | 333/82 R |
| 2,957,984 | 10/1960 | Granquist | 333/82 R X |
| 3,105,947 | 10/1963 | Foster et al. | 333/82 R |
| 3,697,904 | 10/1972 | Mohri et al. | 334/51 |
| 3,789,331 | 1/1974 | Miner et al. | 334/78 X |

*Primary Examiner*—Paul L. Gensler
*Attorney, Agent, or Firm*—Armstrong, Nikaido & Marmelstein

[57] ABSTRACT

A radio frequency tuner for ultra-high frequency range provided with an improved fine tuning device in which a conductor plate member is movably disposed in the vicinity of a resonant line whose one end is connected to a variable capacity element for tuning and whose other end is connected to earth directly or through a capacitor, so that the characteristic impedance of the distributed constant line is varied by driving the conductor plate member toward or away from the resonant line for fine adjustments of the tuned frequency.

10 Claims, 7 Drawing Figures

UHF TUNER HAVING FREQUENCY SETTING FINE TONED BY VARYING CHARACTERISTIC IMPEDANCE OF RESONANT LINE

The present invention relates to a radio frequency tuner and more particularly, to a radio frequency tuner for extremely high frequency ranges which is provided with an improved fine tuning device.

Commonly, a radio frequency tuner, for example, for ultra-high frequency bands employed in television broadcasting and the like, especially one equipped with a detent or click-stop arrangement for channel selection includes at least one capacitor of variable capacity such as a variable condenser having a main tuning shaft for adjusting tuning frequencies, a rough adjustment shaft for rotating the main tuning shaft of the variable condenser in such a manner that the tuning frequencies are varied, step by step, for each of the channels, and a fine tuning shaft for continuously rotating said main tuning shaft to a very slight degree at any desired point where the rough adjustment shaft is detained in the click-stop arrangement for reception of a particular channel. The main tuning shaft of the variable condenser is adapted to be rotated selectively by the rough adjustment shaft and by the fine tuning shaft, through mechanisms such as a gear train, friction devices, cams, clutches, ratches and the like, for correctly adjusting receiving frequency to broadcasting frequency.

The conventional radio frequency tuner of the above desribed type, however, has such disadvantages that the selective rotation of the main tuning shaft of the variable condenser by the rough adjustment shaft and by the fine tuning shaft inevitably complicates the mechanisms, thus resulting in a large size of the tuner itself with consequent high manufacturing cost, nand also that it is difficult to completely remove electrical interference between the rough adjustment portion and the fine tuning portion, thus lacking in accuracy in tuning function.

Meanwhile, there has conventionally been proposed a radio frequency tuner, for example, by U.S. Pat. No. 3,059,195, in which the tuning within the bands is effected through variation of the capacity in the tuned circuit, which tuner, however, still has disadvantages in that the construction thereof is rather complicated employing the tracking mechanism coupled to the band changing knob.

Accordingly, an essential object of the present invention is to provide a tuner for extremely high frequency ranges equipped with an improved fine tuning device free from interference between rough adjustment portion and fine tuning portion with substantial elimination of disadvantages inherent in the conventional tuners.

Another important object of the present invention is to provide a tuner of the above described type which is accurate in functioning and easy to operate.

A further object of the present invention is to provide a tuner of the above described type which is simple in construction and compact in size with consequent low manufacturing cost.

According to a preferred embodiment of the present invention, a conductor plate member is movably disposed in the vicinity of a resonant line whose one end is connected to a variable capacity element for tuning and whose other end is connected to earth directly or through a capacitor, so that characteristic impedance of a distributed constant line is varied by driving said conductor plate member toward or away from the resonant line for fine adjustments of the tuned frequency, by which arrangement, the rough adjustment portion is perfectly separated from the fine tuning portion in the adjustment mechanism of the tuned frequency, thus the interference therebetween being advantageously eliminated, with simple construction and compact size of the tuner itself.

Figure 2:
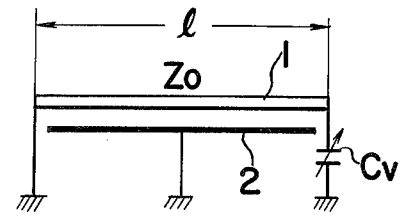
Figure 3:
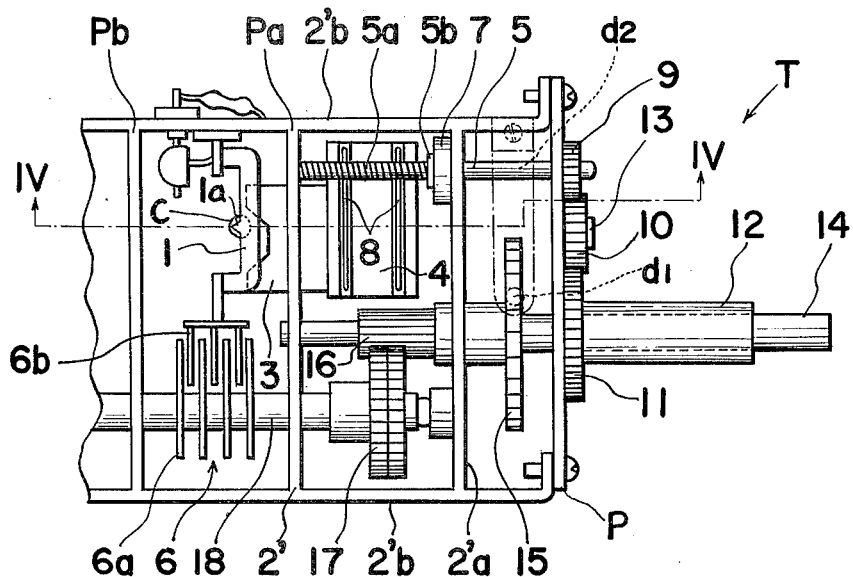
Figure 4:
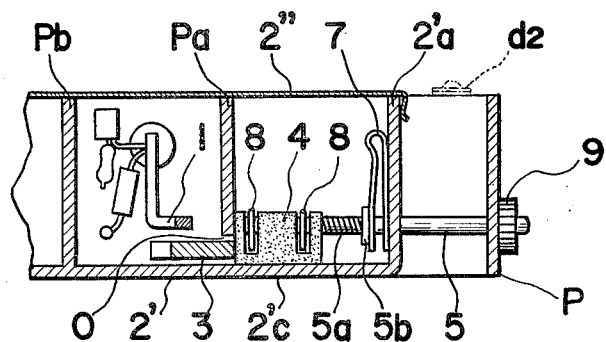
Figure 4:
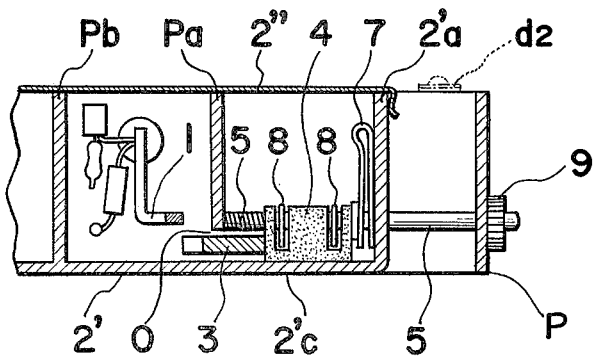
Figure 5:
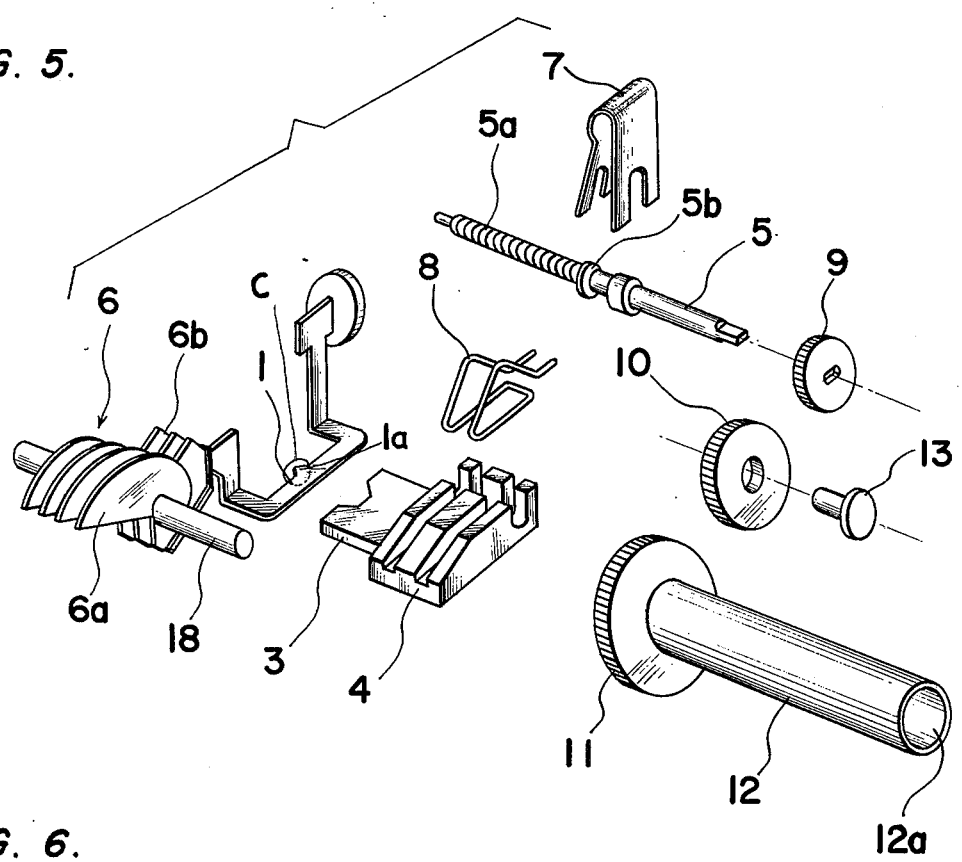
Figure 6:
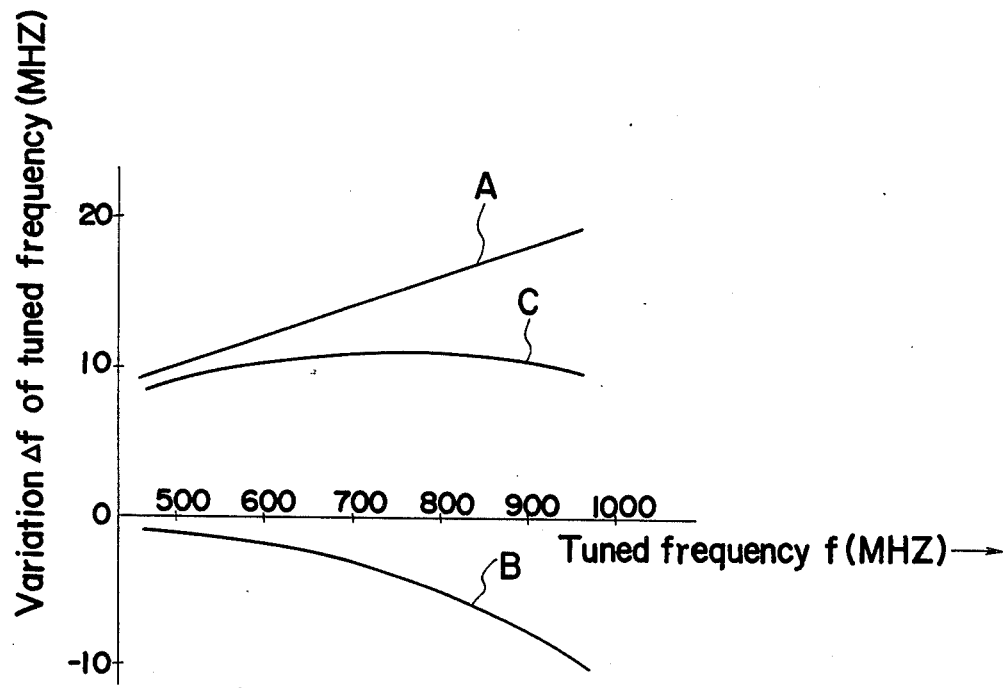

These and other objects and features of the present invention will become apparent from the following description taken in conjunction with the preferred embodiment thereof with reference to the accompanying drawings, in which;

FIGS. 1 and 2 are circuit diagrams explanatory of the principles of tuning circuits of $\lambda/2$ and $\lambda/4$ types respectively, FIG. 3 is a schematic top plan view, partly broken away, of an ultra-high frequency tuner of the invention including an improved fine tuning device therein, with a top wall of a casing thereof removed, FIG. 4($a$) is a side sectional view, taken along the line IV—IV in FIG. 3 with the top wall of the casing thereof attached, showing a movable conductor plate member in one position, FIG 4($b$) is a similar view to FIG. 4($a$), but shows the movable conductor plate member thereof in the other position, FIG. 5 is an exploded view showing important parts of the fine tuning device incorporated in the tuner of FIG. 3, and FIG. 6 is a graph showing relations between tuned frequencies and very small variations in the tuned frequencies.

Before the description of the present invention proceeds, it is to be noted that like parts are designated by like reference numerals throughout several views of the attached drawings.

Referring now to FIGS. 1 and 2, there are shown circuit diagrams explanatory of the principles of tuning circuits of $\lambda/2$ and $\lambda/4$ types employed in ultra-high frequency tuners. In each of the diagrams, a resonant line 1 is disposed adjacent to a grounded electrode 2 which surrounds the resonant line 1 for constituting a distributed constant line together with said resonant line 1, which grounded electrode 2 is normally formed by an outer conductor or a casing of the ultra-high frequency tuner, while $Cv$ denotes capacity of a variable condenser, $Cf$ shows a fixed capacity of concentrated constant nature determined by transistor and fixed capacity capacitor or the like, $Zo$ represents the characteristic impedance of the distributed constant line and $l$ denotes effective length of the distributed constant line. The tuned frequencies $f$ of the tuning circuits of $\lambda/2$ and $\lambda/4$ types of the above described construction are given by the following equations (1) and (2) respectively.

$$2\pi f C v Z o \tan(\beta l - \theta) = 1$$

wherein, $$\tan\theta = \frac{1}{2\pi f Z o C f} \quad (1)$$

$$2\pi f C v Z o \tan\beta l = 1 \quad (2)$$

where $\beta$ is a phase constant which is given by the following equation, with $Vc$ representing velocity of light.

$$\beta = \frac{2\pi f}{Vc} \qquad (3)$$

Meanwhile, it is known that, in the ordinary ultra-high frequency tuners, a fairly good approximation is obtained on the assumption that $\tan\beta l \simeq \beta l$ and $\tan\beta l \cdot \tan\theta << 1$, in which case, the equations (1) and (2) can readily be solved for $f$, with the following two equations (4) and (5) being thus obtainable.

$$f^2 = \frac{Vc(Cf + Cv)}{4\pi^2 Zol C f Cv} \qquad (4)$$

$$f^2 = \frac{Vc}{4\pi^2 Zol Cv} \qquad (5)$$

In order to vary the tuned frequency $f$ on the basis of the above equations (4) and (5), either of the characteristic impedance $Zo$ of the distributed constant line, the effective length $l$ of the distributed constant line and the capacity $Cv$ of the variable condenser may be varied. However, due to the reasons that it is difficult to vary the characteristic impedance $Zo$ throughout entire band range of the ultra-high frequency (UHF) broadcasting and also that variation of the effective length $l$ results in marked reduction of quality factor Q owing to nature of construction, it is common practice to exclusively alter the capacity $Cv$ for the variation of the tuned frequency in the tuners of the above described type. From the foregoing description, it will be seen that the tuner of the present invention is particularly characterized in the arrangement thereof that after the rough adjustment for the tuned frequency is effected through variation of the capacity $Cv$ of the variable condenser, the variation of the characteristic impedance $Zo$ is advantageously utilized for the fine tuning of the tuned frequency.

Referring also to FIGs. 3 to 5, there is schematically shown construction of the fine tuning device as incorporated in the tuner T of the invention. As is seen from FIGS. 3 to 4(b), a casing 2' of the metallic or conductive material for the tuner T is of generally rectangular box-like configuration open at the upper portion and includes a front wall 2'a, side walls 2'b, a bottom wall 2'c, and a rear wall (not shown), on which upper portion, a top wall 2'' of similar material is releasably mounted to form an outer conductor for the tuner T. The side walls 2'b further extend forward from the front wall 2'a, with extreme front edges of the walls 2'b being suitably bent for securing a front plate p thereto in spaced and parellel relations to the front wall 2'a so as to provide a space therebetween. Within the casing 2', a fixed conductor or resonant line 1 having a flat U-shaped lower portion with a projection 1a formed at the central portion thereof and terminal plates extending at right angles from opposite ends of the U-shaped lower portion is disposed in a space between partition plates pa and pb, with the U-shaped lower portion being in spaced and parallel relations to the bottom wall 2'c of the casing 2', while one of the terminal plates of the resonant line 1 is connected to stator plates 6b of a variable condenser 6 as a variable capacity element for tuning and the other of the terminal plates is suitably earthed directly or through a capacitor. The rotor plates 6a of the variable condenser 6 are secured to a main tuning shaft 18 which extends through the casing 2' and is rotatably supported by the front wall 2'a and the rear wall (not shown) of the casing 2'. A flat plate-like conductor member 3, for example, of metallic material is secured, in a direction parallel to the surface of the bottom wall 2'c, on a support member 4 of insulating material which is movably disposed on the bottom wall 2'c within a space between the front wall 2'a and the partition plate pa, while a rod member 5 having an externally threaded portion 5a thereon extends through the front wall 2'a and rotatably supported by the partition plate pa and the front plate p, with the threaded portion 5a thereof engaging, through a corresponding groove formed on the support member 4, a wire spring 8 fitted in a corresponding slit formed in the support member 4. The threaded rod member 5 is further provided with a collar 5b in a position adjacent to the front wall 2'a, and a plate spring 7 of approximately V-shaped cross section is inserted between the collar 5b and the wall 2'a to prevent horizontal play of the rod member 5, so that upon rotation of the rod member 5, the support member 4, to which the conductor plate member 3 is secured, moves forward or backward horizontally, depending on the direction of rotation of the member 5. As the support member 4 moves, the conductor plate member 3 simultaneously moves through a corresponding slot O formed at the lower portion of the partition plate pa toward or away from the resonant line 1, which movement of the plate member 3 varies the characteristic impedance $Zo$ of the distributed constant line.

It should be noted here that the disposition of the flat U-shaped lower portion of the resonant line 1 facing the conductor plate member 3 adjacent to the surface of the bottom wall 2'c of the casing 2', as shown in FIG. 5, forms a capacitor C between the projection 1a of the resonant line 1 and the casing 2' for grounding, in cases where provision of such a capacitor is required to improve characteristics of automatic frequency control (referred to as AFC hereinbelow), and that the resonant line 1 described as formed by the U-shaped lower portion and the right-angled terminal plate portion in the above embodiment may of course be replaced by a straight member without bending when an ordinary capacitor having lead lines is employed or when no AFC device is adopted.

Other points to be noted are that the conductor plate member 3 has a cut-out portion at the front edge thereof so as not to contact the bare capacitor C for the AFC characteristics improvement when the same member 3 is fully inserted between the resonant line 1 and the casing 2', which cut-out portion suitably tapered at side edges thereof is effective for preventing rapid variations of the capacity at any fixed position upon insertion or withdrawal of the conductor plate member 3, and that, in a tuner in which the bare capacitor C is not employed, the cut-out portion described as formed in the above embodiment may be dispensed with, and the front edge of the plate member 3 may be formed straight and sharp or into various shapes depending on the requirements.

It should also be noted here that the wire spring 8 engaging the threaded portion 5a of the rod member 5 is adapted to slip over the screw, upon further rotation of the rod member 5 to such an extent that the support member 4 contacts either the partition plate pa or the collar 5b, so that the further movement of the support member 4 therefrom is prevented for safety purpose.

Still referring to FIGS. 3 to 5, the tuner T has a rough adjustment shaft 14 for rotating the main tuning shaft 18, and a fine tuning shaft 12 for turning the threaded rod member 5 so as to move the conductor plate member 3 together with the support member 4, which shafts 14 and 12 are coaxial with each other, with the shaft 14 extending through a corresponding bore 12a (FIG. 5) formed in the shaft 12 and being rotatably supported by the front plate p and the partition plate pa, while the shaft 12 integrally formed with or fixedly attached to a gear 11 is rotatably mounted on the front plate p through suitable means (not shown), which gear 11 engages a gear 9 secured to the extreme end of the threaded rod member 5 which extends through the front plate p via an intermediate gear 10 rotatably mounted on the plate p by a shaft 13. Further secured to the rough adjustment shaft 14 are a detent wheel 15 having notches corresponding to the number of channels to be received and positioned between the front plate p and the front wall 2'a for engagement with a detent ball d1 (shown in a chain line in FIG. 3) suitably urged toward the notches by a spring plate d2 (shown in a chain line in FIG. 3) fixed to the casing 2', and a gear 16 positioned between the front wall 2'a and the partition plate pa, which gear 16 in turn meshes with a gear 17 secured to the main tuning shaft 18. It is to be noted that in FIG. 4(a), the conductor plate member 3 is fully inserted into the space between the resonant line 1 and the bottom wall 2'c of the casing 2', while in FIG. 4(b), the member 3 is fully moved to the right, with the front edge of the member 3 being spaced away from the resonant line 1, and that in FIG. 5, an exploded view only for the parts of the fine tuning portion is shown for clarity.

By this arrangement, upon rotation of the rough adjustment shaft 14, the detent wheel 15 is rotated, step by step, with each of the notches thereof engaging the ball d1 at each channel, while the gear 16 in mesh with the gear 17 rotates the main tuning shaft 18 for the variable condenser 6 for rough adjustment of the tuned frequency. Meanwhile, when the fine tuning shaft 12 is rotated, the rotation is transmitted to the threaded rod member 5 through the gears 11, 10 and 9 so as to selectively move the support member 4 and consequently the conductor plate member 3 horizontally toward and away from the resonant line 1 for fine adjustment of the tuned frequency.

It should be noted here that the conductor plate member 3 may be earthed to the casing 2', but that the same needs not necessarily be earthed to the casing 2'. The conductor plate member 3 will hereinbelow be referred to as a grounded type movable conductor plate member when earthed to the casing 2', and as a non-grounded type movable conductor plate member when not earthed to the casing 2'.

Still referring to FIGS. 3 to 5, when the inductance of the resonant line 1 per unit length is shown by $Lo$, and the electrostatic capacity of the resonant line 1 per unit length to be formed when the conductor plate member 3 is fully inserted between the resonant line 1 and the casing 2' as in FIG. 4(a), and also when the member 3 is fully spaced away from the resonant line 1 as in FIG. 4(b) are designated by $Ca$ and $Cb$ respectively, it is clear from the drawings that $Ca > Cb$. It is to be noted that if the movable conductor plate member 3 of the grounded type is employed, the electrostatic capacity $Ca$ is a function of distance between the member 3 and the resonant line 1, while in the movable conductor plate member 3 of the non-grounded type, the capacitance $Ca$ is a function of distance between the member 3 and the resonant line 1 and also of the thickness of the member 3. When the characteristic impedances of the distributed constant lines in FIGS. 4(a) and 4(b) are represented by $Zoa$ and $Zob$ respectively, the values of $Zoa$ and $Zob$ are given by the following equations (7) and (8) through employment of the inductance $Lo$, and the capacity $Ca$ and $Cb$.

$$Zoa = \sqrt{\frac{Lo}{Ca}} \quad (7)$$

$$Zob = \sqrt{\frac{Lo}{Cb}} \quad (8)$$

Since $Ca > Cb$ here, the relation $Zoa < Zob$ is established, and the characteristic impedance $Zo$ of the distributed constant line can be decreased through insertion of the movable conductor plate member 3.

Hence, the variation of $\Delta f$ of the tuned frequency, when the characteristic impedance $Zo$ of the distributed constant line is slightly varied by $\Delta Zo$ through insertion of the movable conductor plate member 3, is given by the following equation (9) in any case through differentiaion of the equations (4) and (5) by $Zo$.

$$\Delta f = -\frac{f}{2Zo} \Delta Zo \quad (9)$$

Accordingly, it is noticed that the tuned frequency $f$ is subjected to fine tuning by the amount proportional to the tuned frequency $f$ through minor variation $\Delta Zo$ of the characteristic impedance $Zo$.

It should be noted, however, that in the ultra-high frequency tuner, it is often requested to maintain the amount of variation of the fine tuning frequency constant, irrespective of the tuned frequency, in which case, the position of the movable conductor plate member 3, when inserted, has only to be adjusted to lie as close to the variable condenser 6 as possible. In the above described state, the capacity $Cv$ of the variable condenser 6 increases equivalently due to turbulence of impedance in the vicinity of the variable condenser in the distributed constant line, simultaneously with the decrease of the characteristic impedance $Zo$ of the distributed constant line due to insertion of the movable conductor plate member 3. In cases where the very small variation $\Delta Zo$ of the characteristic impedance $Zo$ is accompanied by the very small variation $\Delta Cv$ of the capacity $Cv$, the capacity $Cv$, the variation of $\Delta f$ of the tuned frequency is represented by the following equations (10) and (11) respectively by differentiating the equations (4) and (5).

$$\Delta f = -\frac{f}{2Zo} \Delta Zo - \frac{Vc}{8\pi^2 f Zo l Cv^2} \Delta Cv \quad (10)$$

$$\Delta f = -\frac{f}{2Zo} \Delta Zo - \frac{f}{2Cv} \Delta Cv \quad (11)$$

It should be noted that since the characteristic impedance $Zo$ decreases by the insertion of the movable conductor plate member 3, with equivalent increase of the capacity $Cv$, the very small variations $\Delta Zo$ and $\Delta Cv$ are of different signs, so that the resultant variation to be obtained through composition of the variation of the tuned frequency due to variation of the characteristic impedance $Zo$ and the variation of the tuned frequency due to variation of the above $Cv$ is rendered to be approximately constant over the entire range of the tuned frequency.

Referring also to FIG. 6 in which the above described state is shown in graphical form, a straight line A shows the variation of the tuned frequency due to the very small variation $\Delta Zo$ of the characteristic impedance $Zo$, i.e., values equivalent to the first terms of the equations (10) and (11), while a curve B represents the variation of the tuned frequency due to the very small variation $\Delta Cv$ of the capacity $Cv$, i.e., values equivalent to the second terms of the equations (10) and (11). The variation of the tuned frequency takes the form as shown in the curve B of FIG. 6 due to the fact that the higher the tuned frequency is the more the capacity $Cv$ decreases since in the tuner of FIG. 3, the rough adjustment of the tuned frequency is made by the capacity $Cv$ of the variable condenser 6. Although the second term of the equation (10) appears to have a factor seemingly to be inversely proportional to the tuned frequency $f$, thus contradicting the above description, it will be readily surmised that the same, if compared with the equation (4), may be regarded as $Vc/4\pi^2 fZo/Cv \simeq f$ through rough approximation and is much the same form as the second term of the equation (11).

Accordingly, if the shape of the movable conductor plate member 3 and the place of insertion thereof are determined in such a manner that the variations of the tuned frequency due to the small variations of the characteristic impedance $\Delta Zo$ and the capacitance $\Delta Cv$ cancel each other by a proper amount, the small variation $\Delta f$ of the tuned frequency shows a frequency characteristics as shown in curve C which is composed of the curves A and B of FIG. 6, thus making it possible to obtain an approximately uniform fine tuning range of the tuned frequency over the entire ultra-high frequency broadcasting band.

As is clear from the foregoing description, according to the tuner of the invention, the fine tuning portion thereof employs, for fine adjustments of the tuned frequency, the movable conductor plate member of substantially different construction from the conventional fine tuning devices which are related to variable condensers, so that the separation of the rough adjustment mechanism and the fine tuning mechanism is effected readily and perfectly with consequent disappearance of interference therebetween, which construction is particularly effective in ultra-high frequency tuners having the detent or click-stop arrangement wherein the adjustment of the tuned frequency is effected through two systems i.e., the rough adjustment and fine adjustment.

Furthermore, it is another advantage of the tuner of the invention that the simple construction thereof makes it possible to render the tuner extremely compact in size, with resultant low manufacturing cost.

It is needless to say that, although the present invention is described mainly with reference to the ultra-high frequency tuner wherein the rough adjustment of the tuning is mechanically effected, the concept of the present invention is effectively and readily applicable to a tuner of electronic tuning type in which a variable capacitance diode is employed for the variable capacity element, and that the gear train and the threaded rod member arrangement described as employed for moving the conductor plate member by the rotation of the fine tuning shaft may be replaced by any other suitable means so long as such means serve the purpose to reciprocate the conductive plate member toward and away from the resonant line for the variation of the characteristic impedance.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:
1. A radio frequency tuner for an extremely high frequency range said tuner comprising:
   a. a grounded casing;
   b. a rough tuning portion including a variable capacitor for tuning to one of a plurality of frequencies in a predetermined band, said capacitor including a fixed element and a movable element which rotates about an axis;
   c. a fine tuning portion for the fine adjustment of the one of the plurality of frequencies to which said rough tuning portion is tuned, said find tuning portion comprising a distributed constant line including a resonant line having one end connected to said fixed element of said variable capacitor and the other end connected to said casing;
   d. a conductor element movably disposed adjacent to said resonant line for selectively being driven toward and away from said resonant line to thereby vary the characteristic impedance of said distributed constant line to thereby finely adjust the tuned frequency;
   e. a first rotary shaft means connected to said movable element and rotatably carried by said housing for adjusting the position of said movable element relative to said fixed element to thereby vary the capacitance of said variable capacitor;
   f. a second rotary shaft means coaxially and rotatably provided on said first rotary shaft means;
   g. moving means operably coupled to said second rotary shaft means for moving said conductor element with respect to said resonant line upon the rotation of said second shaft means to thereby finely adjust the position of said conductor element.
2. A radio frequency tuner as claimed in claim 1, wherein said other end of said resonant line is connected directly to said casing.
3. A radio frequency tuner as claimed in claim 1, wherein said other end of said resonant line is connected to said casing through a capacitor element.
4. A radio frequency tuner as claimed in claim 1, wherein said casing is grounded and said distributed constant line includes said casing and said resonant line.
5. A radio frequency tuner as claimed in claim 1, wherein said moving means comprisies:
   a. a threaded rod member rotatably supported by said casing and connected to said second shaft means, and
   b. a support member of insulating material movably disposed within said casing and secured to said conductor element, said support member being operably coupled with said threaded rod member so as to selectively insert said conductor element between said resonant line and said casing or to space said conductor element away from said resonant line upon selective rotation of said threaded rod member.

6. A radio frequency tuner as claimed in claim 5, wherein said threaded rod member is operably coupled with said second shaft means through a transmission means.

7. A radio frequency tuner as claimed in claim 1, wherein said resonant line is a first plate member of conductive material fixedly disposed within said casing in a spaced relation to said casing.

8. A radio frequency tuner as claimed in claim 7, wherein said conductor element is a second plate member of conductive material.

9. A radio frequency tuner as claimed in claim 8, wherein said second plate member is adapted to lie close to said variable capacitor, when said conductor element is inserted between said first plate member and said casing, wherein the amount of variation of fine tuning frequency is maintained constant irrespective of the tuned frequency.

10. A radio frequency tuner as claimed in claim 8, wherein said second plate member is configured and positioned such that variations of the tuned frequency resulting from a very small variation of the charcteristic impedance of said distributed constant line and from a very small variation of the capacity of said variable capacitor cancel each other by a predetermined amount whereby a constant tuned-frequency fine tuning range is obtained over the entire predetermined band of broadcasting.

* * * * *